(12) United States Patent
Goto (10) Patent No.: US 7,971,163 B2
(45) Date of Patent: Jun. 28, 2011

(54) PROPERTY GENERATING APPARATUS, PROPERTY GENERATING METHOD AND PROGRAM (75) Inventor: Atsuko Goto, Tokyo (JP)

(73) Assignee: NEC Corporation, Tokyo (JP)

( * ) Notice: Subject to any disclaimer, the term of this patent is extended or adjusted under 35 U.S.C. 154(b) by 300 days.

(21) Appl. No.: 12/391,752

(22) Filed: Feb. 24, 2009

(65) Prior Publication Data
US 2009/0222778 A1    Sep. 3, 2009

(30) Foreign Application Priority Data

Feb. 28, 2008    (JP) ................................. 2008-048382

(51) Int. Cl.
*G06F 17/50*    (2006.01)

(52) U.S. Cl. ........................................ 716/101; 716/104

(58) Field of Classification Search .................... None
See application file for complete search history.

(56) References Cited

FOREIGN PATENT DOCUMENTS

| | | |
|---|---|---|
| JP | 9-106684 A | 4/1997 |
| JP | 2000137745 A | 5/2000 |
| JP | 2002182926 A | 6/2002 |
| JP | 2003006256 A | 1/2003 |
| JP | 2003085221 A | 3/2003 |
| JP | 2006252438 A | 9/2006 |
| JP | 2006293891 A | 10/2006 |
| JP | 2007114881 A | 5/2007 |
| JP | 2007264994 A | 10/2007 |

OTHER PUBLICATIONS

Japanese Office Action for JP2008-048382 issued Mar. 10, 2010.

*Primary Examiner* — Leigh Marie Garbowski (57) ABSTRACT

Disclosed is a property generating apparatus which generates a property representing a specification of an integrated circuit and verifying design information on the integrated circuit described in RTL (Register Transfer Level). The property generating apparatus includes: a storage unit, which stores a register name to identify a register; an address expanding unit, which expands property abbreviated description information on a group of registers including the register, and generates a group of addresses; an RTL analysis unit, which selects a group of register names from the register name stored in the storage unit; and a property generation unit, which generates the property by correlating the group of addresses with the group of register names.

15 Claims, 8 Drawing Sheets

```
$ TOP    ="AAA";

$ GSADR  ="A"   ;
$ GSWDT  ="DT"  ;
$ GSSTB  ="STB" ;
$ GSSET  ="SET" ;
$ GSRST  ="RST" ;

$ RESET  ="( ! RESETO && ! RESETE && ! RESET)" ;
$ CLOCK  ="CLK" ;

#Format
($GSADR==$ADR) && ($RESET) && ( !$GSSET && !$GSRST) &&
($CLK) && #3($GSSTB) => =9($GSWDT) == #10($REG) ;
```

501 (pointing to $ADR)
502 (pointing to $REG)
107

Fig.7

(A==16'b0011000000000100)&&(!RESETC && !RESETE && !RESET)&& (!SET && !RST)
&& (CLK)&& #3(STB)=> #9(DT)== #10(top/sub1a/sub2a/sub3a/sub4a/sub5a/sub6a/r0_reg) ;
(A==16'b0011000000100100)&&(!RESETC && !RESETE && !RESET)&& (!SET && !RST)
&& (CLK)&& #3(STB)=> #9(DT)== #10(top/sub1a/sub2a/sub3a/sub4a/sub5b/sub6a/r0_reg) ;
(A==16'b0011000001000100)&&(!RESETC && !RESETE && !RESET)&& (!SET && !RST)
&& (CLK)&& #3(STB)=> #9(DT)== #10(top/sub1a/sub2a/sub3b/sub4a/sub5a/sub6a/r0_reg) ;
(A==16'b0011000001100100)&&(!RESETC && !RESETE && !RESET)&& (!SET && !RST)
&& (CLK)&& #3(STB)=> #9(DT)== #10(top/sub1a/sub2a/sub3b/sub4a/sub5b/sub6a/r0_reg) ;
(A==16'b0011000010000100)&&(!RESETC && !RESETE && !RESET)&& (!SET && !RST)
&& (CLK)&& #3(STB)=> #9(DT)== #10(top/sub1a/sub2a/sub3c/sub4a/sub5a/sub6a/r0_reg) ;
(A==16'b0011000010100100)&&(!RESETC && !RESETE && !RESET)&& (!SET && !RST)
&& (CLK)&& #3(STB)=> #9(DT)== #10(top/sub1a/sub2a/sub3c/sub4a/sub5b/sub6a/r0_reg) ;
(A==16'b0011000011000100)&&(!RESETC && !RESETE && !RESET)&& (!SET && !RST)
&& (CLK)&& #3(STB)=> #9(DT)== #10(top/sub1a/sub2a/sub3d/sub4a/sub5a/sub6a/r0_reg) ;
(A==16'b0011000011100100)&&(!RESETC && !RESETE && !RESET)&& (!SET && !RST)
&& (CLK)&& #3(STB)=> #9(DT)== #10(top/sub1a/sub2a/sub3d/sub4a/sub5b/sub6a/r0_reg) ;

PROPERTY GENERATING APPARATUS, PROPERTY GENERATING METHOD AND PROGRAM

This application is based upon and claims the benefit of priority from Japanese Patent Application No. 2008-048382, filed on Feb. 28, 2008, the disclosure of which is incorporated herein in its entirety by reference.

TECHNICAL FIELD

The present invention relates to a property generating apparatus, which generates a property representing a specification of an integrated circuit.

BACKGROUND ART

An integrated circuit (LSI; Large-Scale Integrated circuit) is designed in an RTL (Register Transfer Level) using a hardware description language. Design information on the LSI described in the RTL and a property expressing a specification of the LSI described in a specification description language are compared by using a verification tool. The verification tool verifies equivalence between the design information and the property.

An LSI includes a circuit structure having plural RTLs of the same type (hereinafter, referred to as one-type-N-sheets structure), where N is an integer. In order to generate a property of such an LSI, a large number of descriptions having similar patterns are necessary. For example, even when a property is generated for a structure corresponding to a single sheet of the one-type-N-sheets structure of the LSI, a large number of descriptions having similar patterns are needed. Accordingly, generating the property for the one-type-N-sheets structure as a whole needs a huge amount of work.

Reducing the work for generating such a property is desired.

Technologies of related arts with respect to the RTL and the property will be described below.

Japanese Patent Application Laid-Open No. 2003-85221 discloses an RTL automatic classification system. The RTL automatic classification system includes RTL analyzing means and RTL output means. The RTL analyzing means generates input/output signal information, for each of at least one logic descriptions written in a first RTL module. The RTL output means converts each logic description into a hierarchy instance, which includes the input/output signal information on each logic description. The RTL output means further converts the first RTL module into a second RTL module, which is hierarchized by hierarchy instances.

Japanese Patent Application Laid-Open No. 2006-293891 discloses a property converting apparatus. The property converting apparatus converts property information, which describes a specification of hardware in a specification description language, into a logically equivalent expression. The property converting apparatus includes syntax information storage means, syntax analysis means and property equivalent conversion means. The syntax information storage means stores property structural unit information including: a structural unit, of which the property information is composed; order of conversion for the structural units in the equivalent transformation; and an expression logically equivalent to the structural unit. The syntax analysis means generates syntax element information, with reference to the property information, which describes an inputted specification of hardware in the specification description language, and to the property structural unit information stored in the syntax information storage means. The syntax element information includes grammatical structure, a structural unit and an expression equivalent to each structural unit. The property equivalent conversion means creates equivalent property information converted from property information of the inputted hardware into a predetermined equivalent expression, based on the syntax element information.

Japanese Patent Application Laid-Open No. 2002-182926 discloses a compilation method, which generates an object code of fixed length instructions from a source program. The compilation method includes a step for detecting an instruction of grouping for variables irrelevant to each other as a whole in a source program, a step for, when the instruction of grouping is detected, grouping the variables based on the instruction of grouping, a step for detecting a reference position of the grouped variables from the source program, and a step for generating the object code for the detected reference position of the variables. The object code appends an offset address of a variable to a base address common to a group, to which the variable belongs, and refers to the variable.

Japanese Patent Application Laid-Open No. 2003-6256 discloses a high level synthesizer unit for a logic circuit. The high level synthesizer unit of the logic circuit performs synthesizes to generate a logic circuit based on action descriptions. The high level synthesizer unit includes an array variable analysis unit and a variable rewriting unit. The array variable analysis unit analyzes an array variable in inputted action descriptions, and generates array variable analysis data, which includes a virtual name assigned to an element of the array, according to a variable name and addresses of elements of the array. The variable rewriting unit generates after-rewriting action descriptions from the action descriptions based on the array variable analysis data. The high level synthesizer unit performs high level synthesis processes for the logic circuit based on the after-rewriting action descriptions.

Japanese Patent Application Laid-Open No. 2006-252438 discloses a verification support apparatus. The verification support apparatus is provided with a semiconductor package. The verification support apparatus includes input means, designation means and detection means. The input means receives input of logic circuit description information on a verification object. The designation means designates, in the verification object, two or more registers, each of which outputs data from one clock domain of a pair of neighboring clock domains. The detection means detects a single register, which converges in the other clock domain (re-convergent register) based on the logic circuit description information on the verification object inputted by the input means, and on two or more registers designated by the designation means.

SUMMARY

An exemplary object of the invention is to provide a property generating apparatus which automatically creates a property representing a specification of an integrated circuit.

A property generating apparatus according to an exemplary aspect of the invention generates a property representing a specification of an integrated circuit and verifying design information on the integrated circuit described in RTL (Register Transfer Level). The property generating apparatus includes: a storage unit, which stores a register name to identify a register; an address expanding unit, which expands property abbreviated description information on a group of registers including the register, and generates a group of addresses; an RTL analysis unit, which selects a group of register names from the register name stored in the storage unit; and a property generation unit, which generates the property by correlating the group of addresses with the group of register names.

A property generation method according to an exemplary aspect of the invention for generating a property representing a specification of an integrated circuit for verifying design information on the integrated circuit described in an RTL (Register Transfer Level), includes: storing a register name to identify a register; expanding property abbreviated description information on a group of registers including the register, and generating a group of addresses; selecting a group of register names from the stored register name; and generating the property by correlating the group of addresses with the group of register names.

A recording medium according to an exemplary aspect of the invention, records a program, which makes a computer execute a process to generate a property representing a specification of an integrated circuit for verifying design information on the integrated circuit described in an RTL (Register Transfer Level), including: a step for storing a register name to identify a register; a step for expanding property abbreviated description information on a group of registers including the register, and generating a group of addresses; a step for selecting a group of register names from the stored register name; and a step for generating the property by correlating the group of addresses with the group of register names.

BRIEF DESCRIPTION OF THE DRAWINGS

Exemplary features and advantages of the present invention will become apparent from the following detailed description when taken with the accompanying drawings in which.

EXEMPLARY EMBODIMENT

A property generating apparatus according to an exemplary embodiment of the present invention will be described in detail with reference to accompanying drawings below.

[Configuration]

Figure 1A:
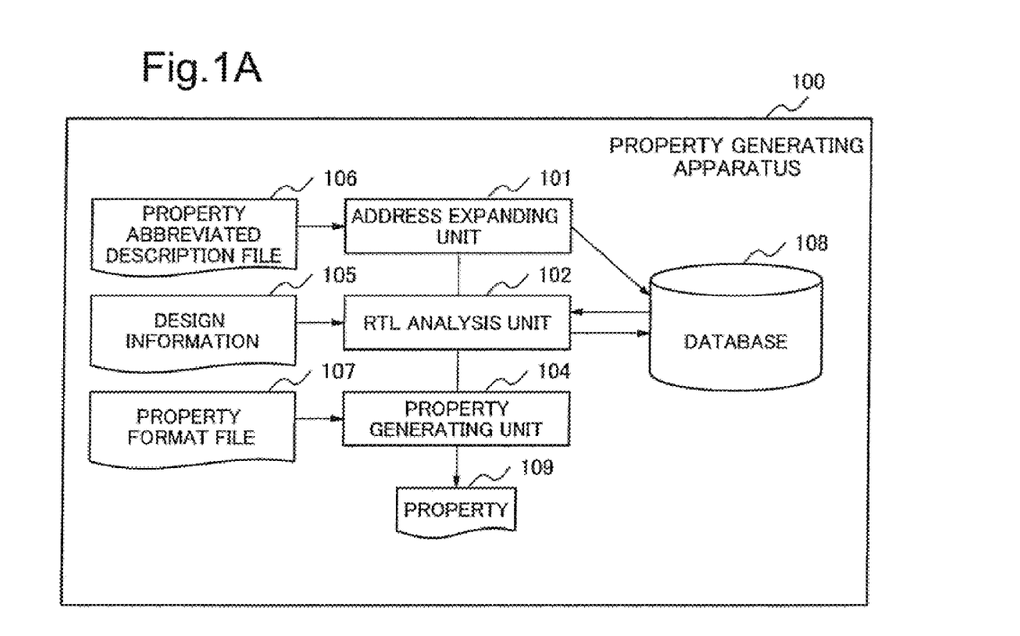
FIGS. 1A and 1B show an example of a property generating apparatus according to an exemplary embodiment.

FIG. 1A illustrates an example of a property generating apparatus according to the exemplary embodiment. A property generating apparatus 100 includes an address expanding unit 101, an RTL (Register Transfer Level) analysis unit 102, a property generating unit 104 and a database 108 (a storage unit).

The address expanding unit 101 receives an input from a property abbreviated description file 106, and outputs a result of expansion to the database 108. The RTL analysis unit 102 receives design information 105 of an integrated circuit described in RTL (hereinafter, referred to as RTL), and outputs an analysis result to the database 108. The property generating unit 104 enters data into a form in a property format file 107, and generates a property 109.

Figure 1B:
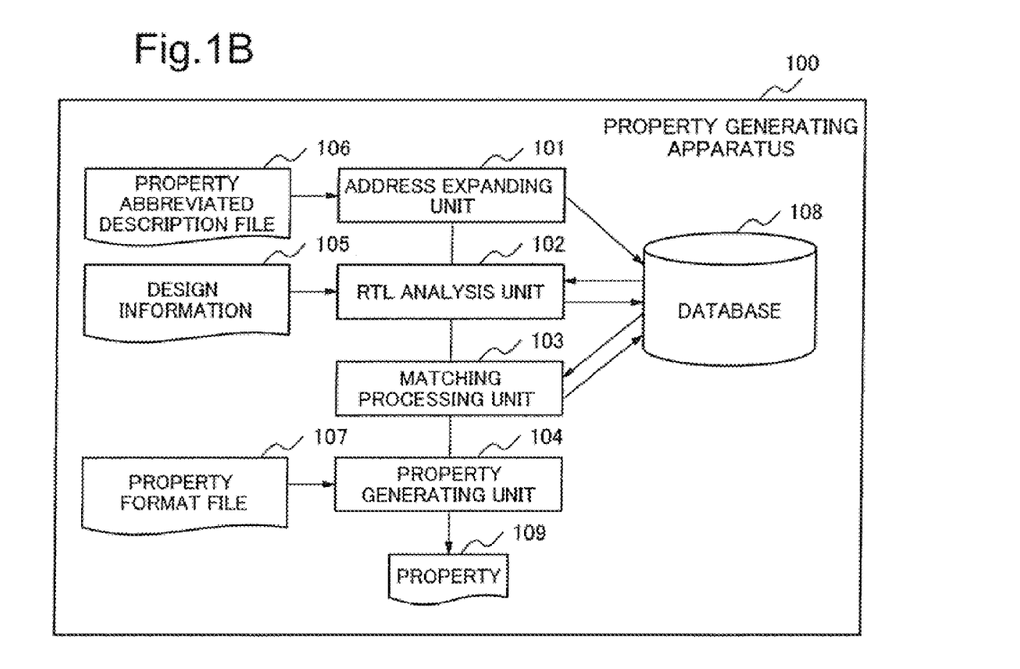

As shown in FIG. 1B, the property generating apparatus 100 may further include a matching processing unit 103, which checks correspondence of data stored in the database, to output a result to the database 108. The property generating unit 104 enters data into the form in the property format file 107 based on the result of the matching processing unit 103, and generates the property 109.

The integrated circuit (LSI; Large-Scale Integrated circuit) is designed in the RTL (Register Transfer Level) using a hardware description language. The design information representing the LSI described in the RTL, and a property expressing a specification of the LSI described in a specification description language, are compared by using a verification tool (not illustrated). The verification tool verifies equivalence of the design information and the property. In order to verify the design information using the verification tool, the property generating apparatus 100 generates the property 109.

Figure 1C:
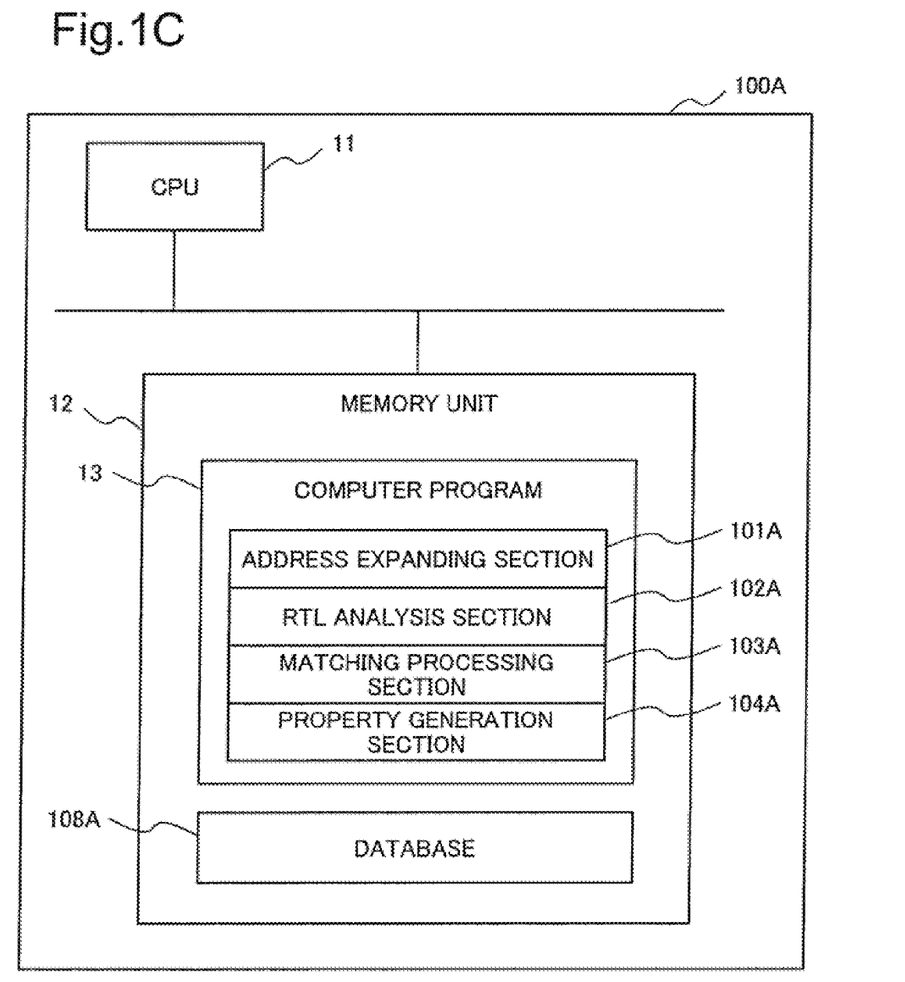
FIG. 1C shows another example of a property generating apparatus according to the exemplary embodiment.

The property generating apparatus according to the exemplary embodiment may be realized by a computer. FIG. 1C indicates an example of the property generating apparatus realized by the computer. A property generating apparatus 100A includes an execution unit 11 and a memory unit 12, which is a recording medium. For example, the execution unit 11 is a CPU (Central Processing Unit). A computer program 13, which the execution unit 11 executes, is stored in the memory unit 12. When the property generating apparatus starts processing, for example, the execution unit 11 loads the computer program 13 from the memory unit 12 to a random access memory (not shown), to perform the processing.

The computer program 13 includes an address expanding section 101A, an RTL analysis section 102A, a matching processing section 103A and a property generation section 104A. The memory unit 12 includes a database 108A (a storage section).

[Operation]

An example of operations of the property generating apparatus according to the exemplary embodiment will be described with reference to FIGS. 2A to 7.

Figure 2A:
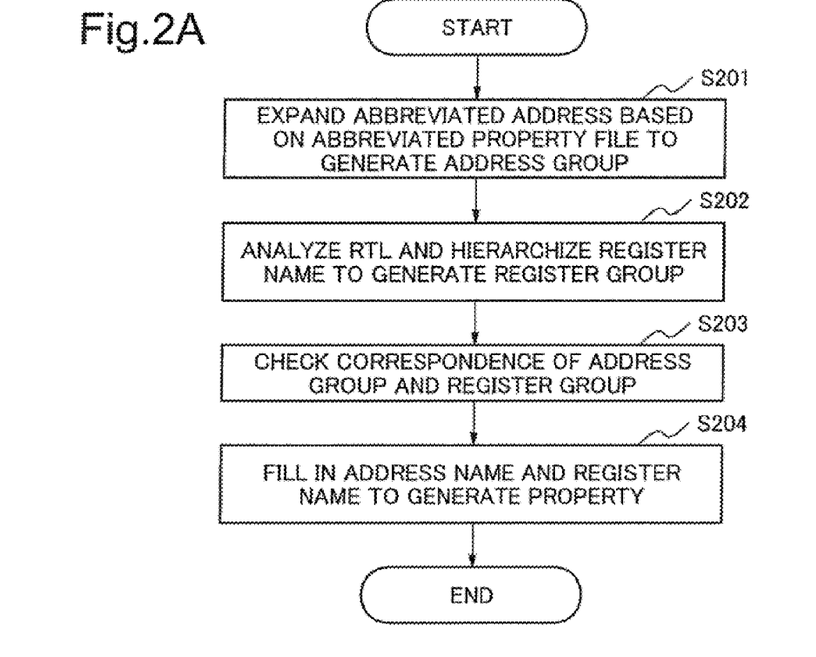
FIGS. 2A and 2B are flowcharts showing an example of operation of a property generating apparatus according to the exemplary embodiment.
Figure 2B:
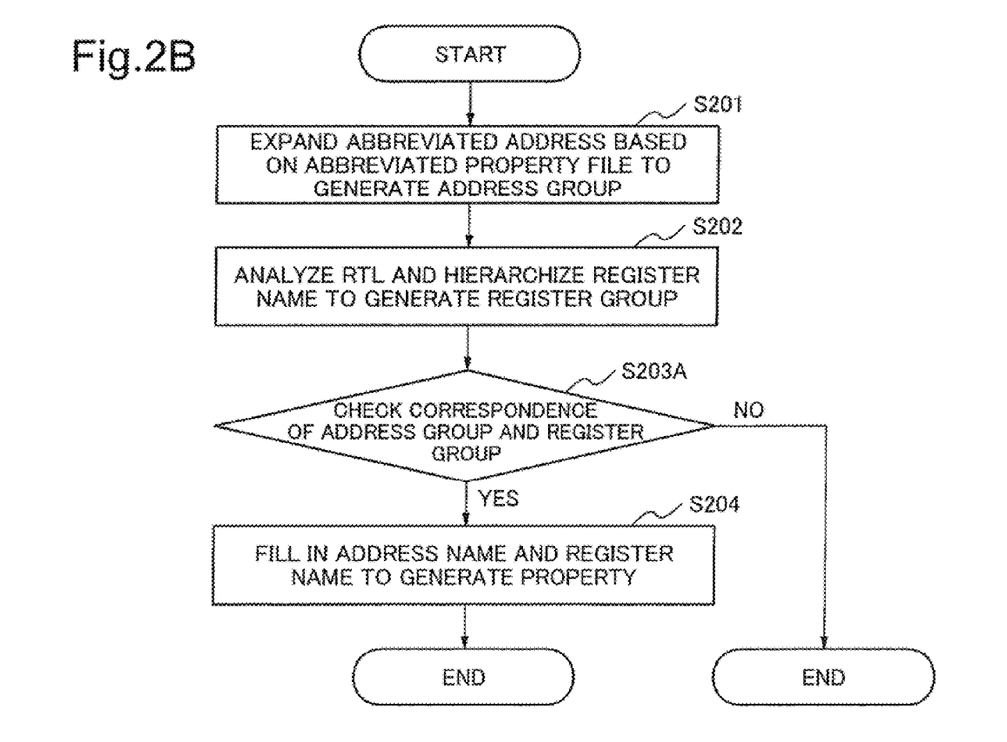

FIGS. 2A and 2B are flowcharts showing the example of operations of the property generating apparatus.

Figure 3A:
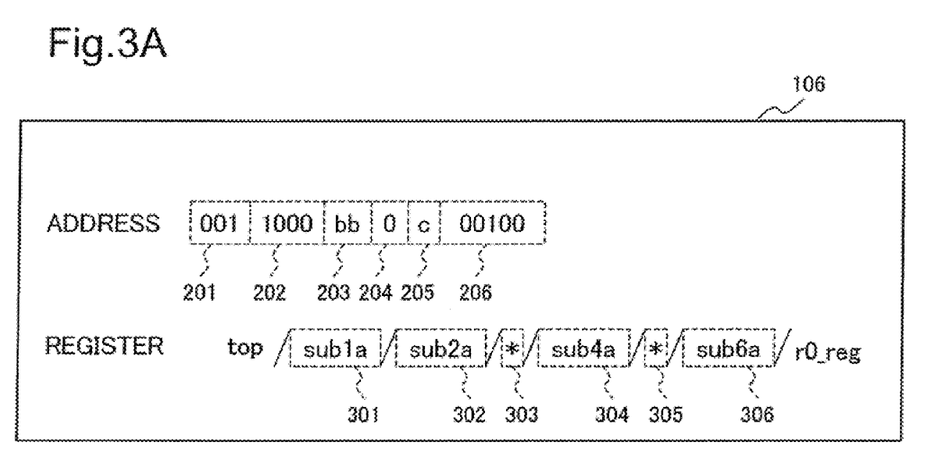
FIGS. 3A and 3B show an example of an abbreviated description of a property according to the exemplary embodiment.

FIG. 3A indicates an example of a property abbreviated description according to the exemplary embodiment.

The abbreviated property file 106 shown in FIG. 3A is inputted to the address expanding unit 101. The property abbreviated description file 106 includes a description with respect to a group of registers in plural registers.

Here, the LSI has a circuit structure using plural identical-type RTLs (hereinafter, referred to as one-type-N-sheets structure), where N is an integer. It is supposed that the plural registers describe the one-type-N-sheets structure of the LSI, and a group of registers among the plural registers corresponds to a structure for one sheet in the one-type-N-sheets structure.

The property abbreviated description file 106 has an abbreviated register name top/sub1a/sub2a/*/sub4a/*/sub6a/r0_reg, and an abbreviated address 001 1000 bb 0 c 00100.

The abbreviated register name top/sub1a/sub2a/*/sub4a/*/sub6a/r0_reg includes a group of hierarchy instances 301-

306. By the abbreviated register name, the group of registers is identified. That is, it is supposed that the hierarchy instances 301, 302, 303, 304, 305 and 306 represent "sub1a", "sub2a", "*", "sub4a", "*" and "sub6a", respectively, which are located under "top" of the abbreviated register name top/sub1a/sub2a/*/sub4a/*/sub6a/r0_reg. However, in the abbreviated register name, specific hierarchy instances 303 and 305 within the group of the hierarchy instances 301-306 are not specified by an address name of a register, such as "sub1a", "sub2a", and are abbreviated by indicating the symbol "*".

The abbreviated address 001 1000 bb 0 c 00100 includes bit sections 201-206, each corresponding to the hierarchy instances 301-306 of the abbreviated register name top/sub1a/sub2a/*/sub4a/*/sub6a/r0_reg. Each of bit sections 201-206 represents a bit string. It is supposed that the bit sections 201, 202, 203, 204, 205 and 206 represent "001", "1000", "bb", "0", "c" and "00100" of the abbreviated address 001 1000 bb 0 c 00100, respectively.

Bit sections 203 and 205 (specific bit sections) among the bit sections 201-206 corresponding to the specific hierarchy instances 303 and 305 do not specify bit strings, such as "001" or "1000". The specific bit sections are indicated by abbreviated bit strings, which correspond to the number of bits, two and one. For example, as symbols corresponding to the number of bits, two and one, alphabetic characters bb and c are used, respectively. The symbol bb is expressed using the same continuing alphabetic characters, since the number of bits is two. Each character in the symbols bb and c is expanded into 0 or 1 as one bit variable.

The address expanding unit 101 expands the abbreviated parts in the abbreviated address 001 1000 bb 0 c 00100 described in the abbreviated property file 106, based on the number of the specific bit sections 203 and 205 (i.e. two), and the number of bits of each of the specific bit sections 203 and 205 (i.e. two and one, respectively), to generate an address group 207 (Step S201). Such process will be described specifically below.

First, assume that an integer n represents the number of specific bit sections, and that integers M(1) to M(n) represent the numbers of bits of n specific bit sections, respectively. Then, there exist m choices for addresses, which are expanded by the abbreviated address, where m is 2 raised to the power of Sum(M) and where Sum(M) is a sum from M(1) to M(n). The address expanding unit 101 generates m choices of addresses as the address group 207 for the abbreviated address.

In FIG. 3A, since the number of bits of the specific bit section 203 is two, there exist four choices for bit strings represented by the specific bit section 203. That is, the bit strings is 00, 01, 10 or 11. Also, there exist two choices for bit strings represented by the specific bit section 205, since the number of bits of the specific bit section 205 is one. That is, the bit strings are 0 and 1. In the case, there are a cube of 2, i.e. eight choices for bit strings represented by the specific bit sections 203 and 205. That is, bit strings which the specific bit section 203 represents are 00, 00, 01, 01, 10, 10, 11 and 11, and bit strings which the specific bit section 205 represents are 0, 1, 0, 1, 0, 1, 0 and 1.

Figure 3B:
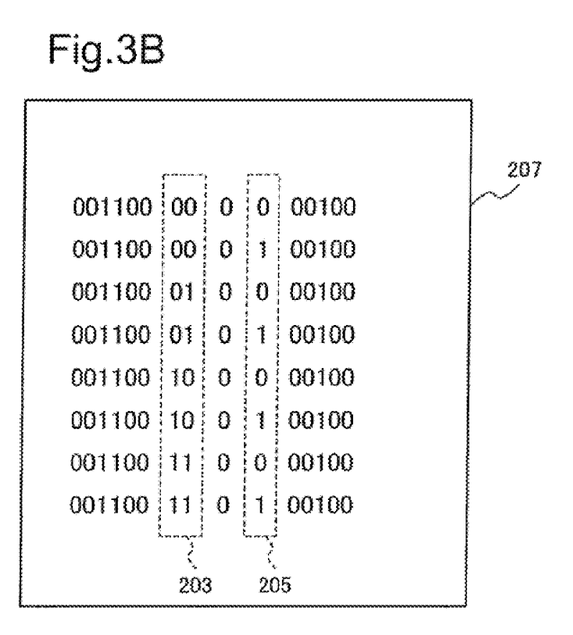

As a result, the address expanding unit 101 generates eight choices of addresses as the address group 207 for the abbreviated address 001 1000 bb 0 c 00100. In the case, as shown in FIG. 3B, the address group 207 is expressed in ascending order as:

001 1000 00 0 0 00100;
001 1000 00 0 1 00100;
001 1000 01 0 0 00100;
001 1000 01 0 1 00100;
001 1000 10 0 0 00100;
001 1000 10 0 1 00100;
001 1000 11 0 0 00100; and
001 1000 11 0 1 00100.

The address expanding unit 101 associates the address group 207 with the abbreviated register name top/sub1a/sub2a/*/sub4a/*/sub6a/r0_reg of the property abbreviated description file 106, and stores the file in the database 108.

Next, the RTL 105 is inputted to the RTL analysis unit 102. The RTL analysis unit 102 analyzes the RTL 105, and stores each register name of plural registers in the database 108 as design information. The register name includes a group of hierarchy instances expressed in an address name as a character string.

The RTL analysis unit 102 generates a tree-structure list of all register names under the designated TOP hierarchy, as hierarchy instance names, and stores the list in the database 108 (S202). The processing will be described specifically with reference to FIG. 4.

Figure 4:
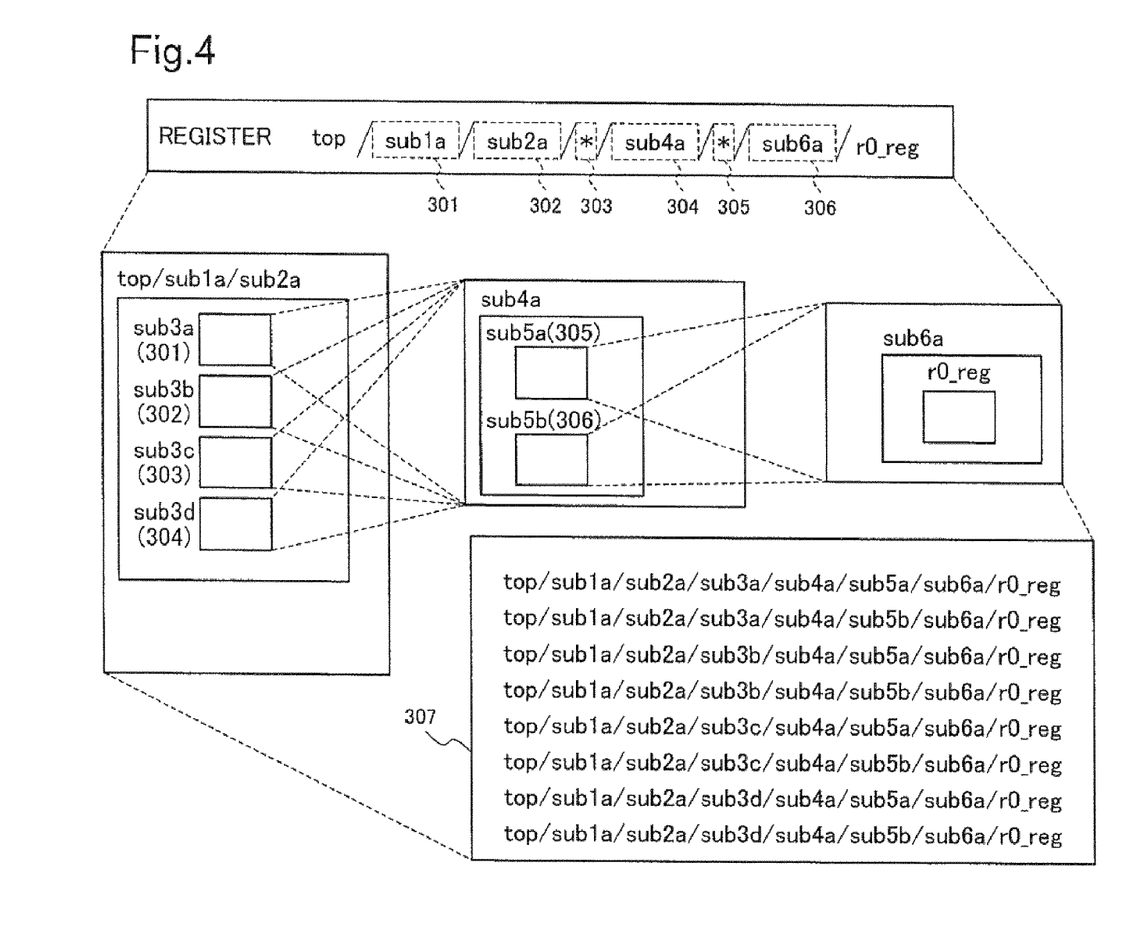
FIG. 4 shows an example of a hierarchical structure of an RTL and a hierarchy instance corresponding to a register name of abbreviated descriptions according to the exemplary embodiment.

First, the RTL analysis unit 102 refers to the database 108. Then, the following register name is selected as a register name group 307 from each register name in plural registers included in the RTL 105.

(1) The register name has the same structure as the group of hierarchy instances 301-306 of the abbreviated register name top/sub1a/sub2a/*/sub4a/*/sub6a/r0_reg stored in the database 108, and further (2) includes hierarchy instances identical with hierarchy instances 301, 302, 304 and 306 other than the specific hierarchy instances 303 and 305.

FIG. 4 shows an example of the hierarchical structure of the RTL and the hierarchy instances corresponding to a register name of the abbreviated description according to the exemplary embodiment.

In the example, as shown in FIG. 4, the register name group 307 is expressed in ascending order as:

top/sub1a/sub2a/sub3a/sub4a/sub5a/sub6a/r0_reg;
top/sub1a/sub2a/sub3a/sub4a/sub5b/sub6a/r0_reg;
top/sub1a/sub2a/sub3b/sub4a/sub5a/sub6a/r0_reg;
top/sub1a/sub2a/sub3b/sub4a/sub5b/sub6a/r0_reg;
top/sub1a/sub2a/sub3c/sub4a/sub5a/sub6a/r0_reg;
top/sub1a/sub2a/sub3c/sub4a/sub5b/sub6a/r0_reg;
top/sub1a/sub2a/sub3d/sub4a/sub5a/sub6a/r0_reg; and
top/sub1a/sub2a/sub3d/sub4a/sub5b/sub6a/r0_reg.

The RTL analysis unit 102 stores a list representing the register name group 307 in the database 108.

The matching processing unit 103 refers to the database 108 and examines whether or not the address group 207 corresponds to the register name group 307. The matching processing unit 103 stores a result of matching in the database 108 (S203). The result of matching is a set of an address name within the address group 207 and a register name within the register name group 307 corresponding to the address name, for example. Then, when the number of the address names within the address group 207 is different from the number of the register names within the register name group 307, an error message may be returned (S203A).

Figure 5:
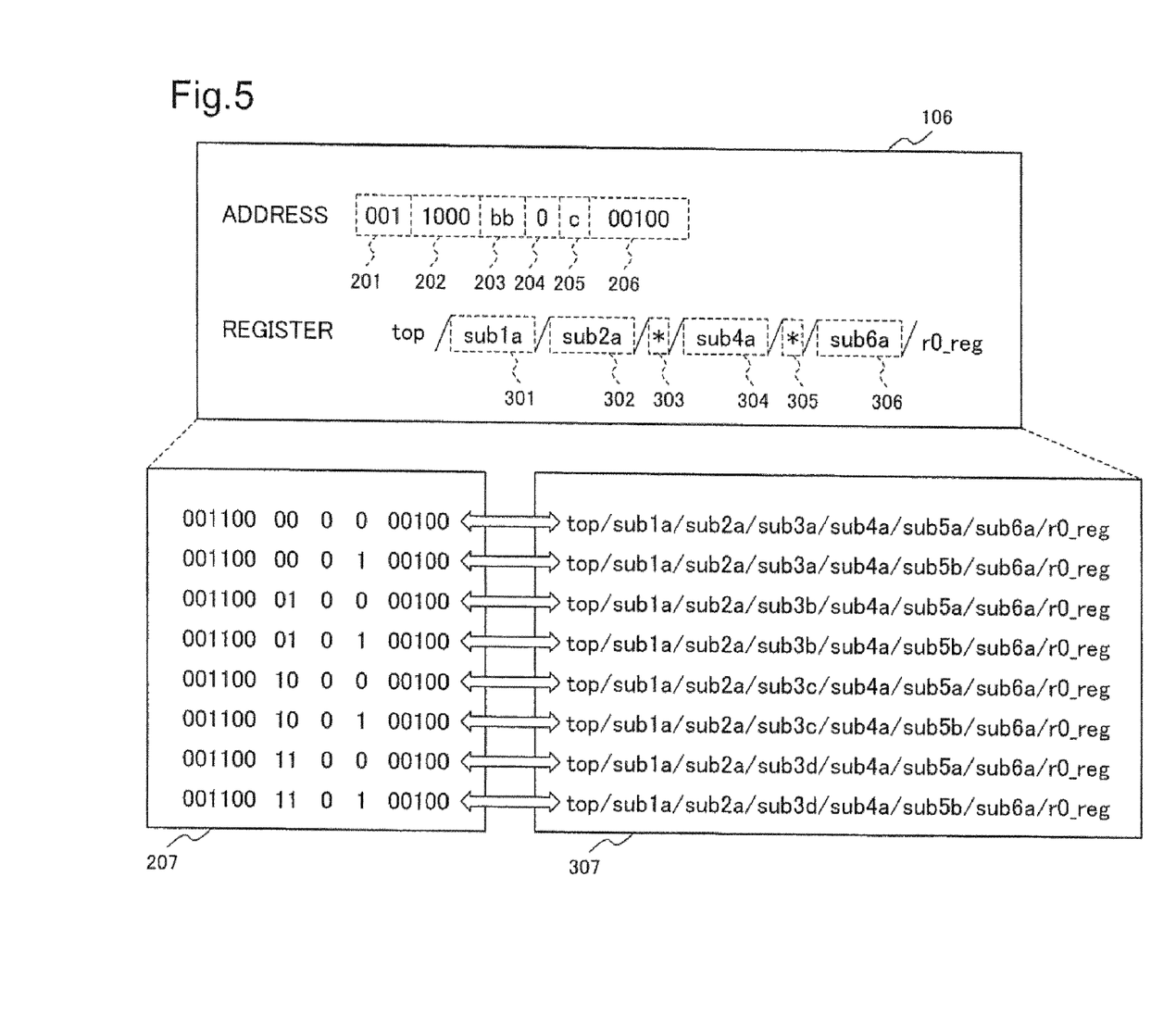
FIG. 5 shows an example of correspondence of a hierarchy instance name and an address according to the exemplary embodiment.

FIG. 5 shows an example where the hierarchy instance names 301-306 correspond to the addresses 201-206 according to the exemplary embodiment.

As shown in FIG. 5, in the exemplary embodiment, corresponding the address group 207 to the register name group 307 means that addresses of the address group 207 arranged in ascending order correspond to register names of the register name group 307 also arranged in ascending order, respectively (for example, the second address 001 1000 00 0 1 00100 and the second register name top/sub1a/sub2a/sub3a/sub4a/sub5b/sub6a/r0_reg)

Figure 6:
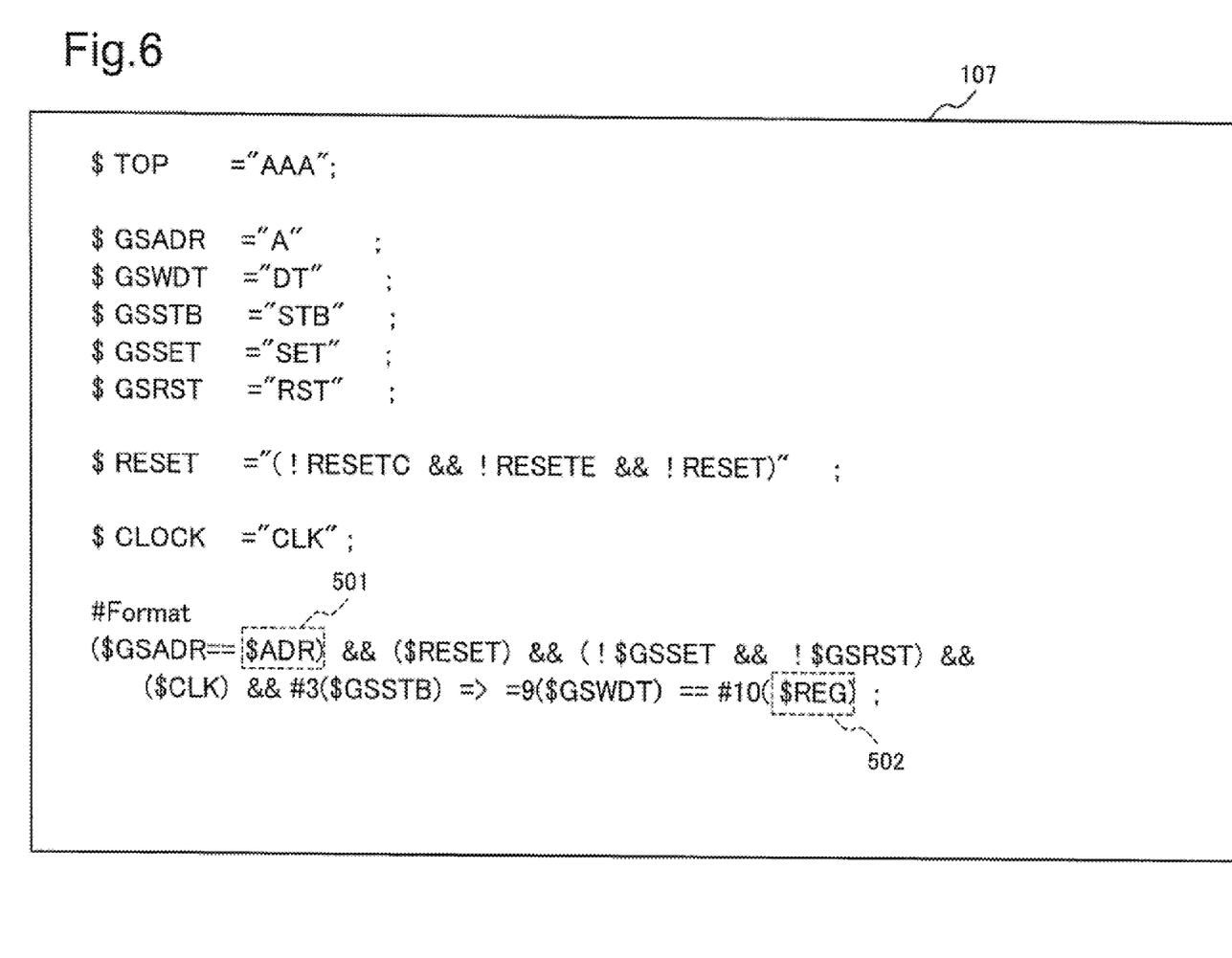
FIG. 6 shows an example of a property format file according to the exemplary embodiment.

The property format file 107, such as shown in FIG. 6, is inputted to the property generating unit 104. A model property, with which an address group and a register name group are correlated, is described in the property format file 107. As shown in FIG. 6, the model property includes a variable 501 for describing an address and a variable 502 for describing a register name.

Figure 7:
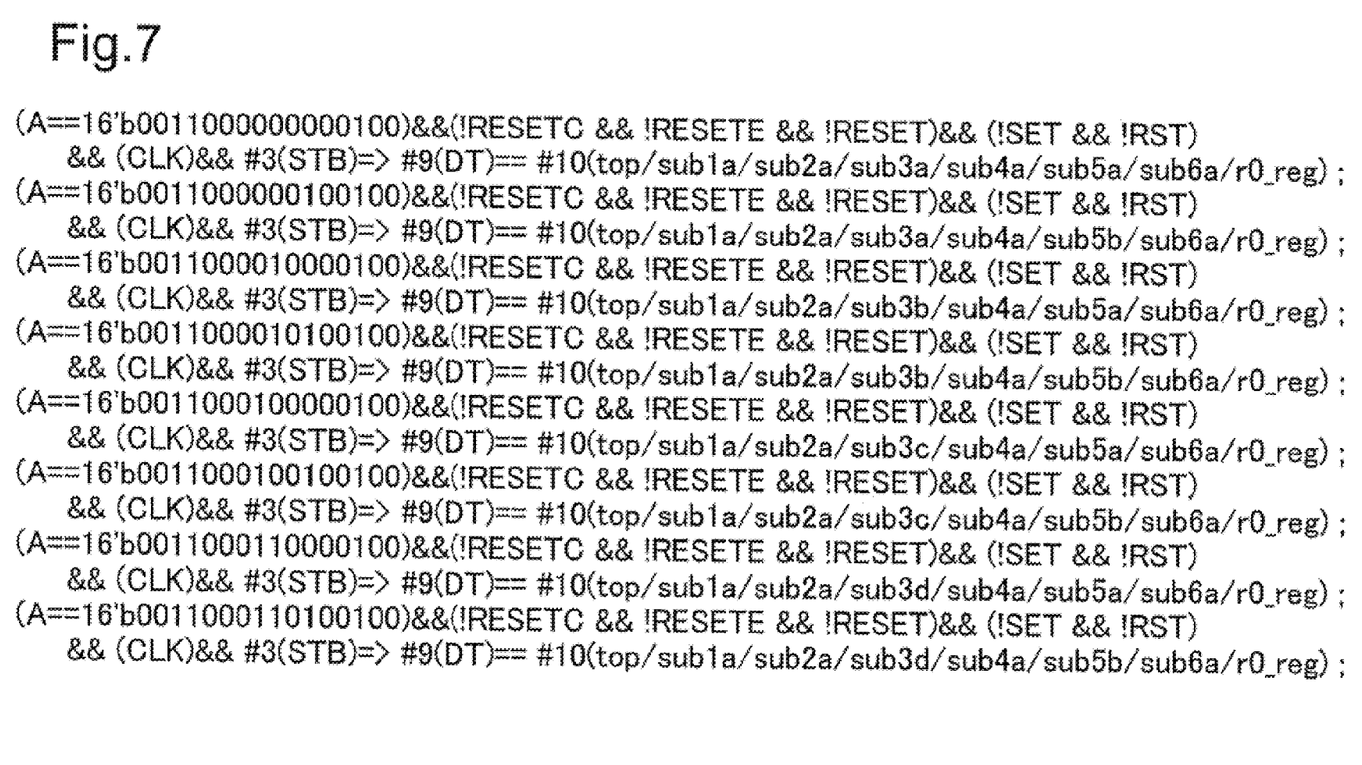
FIG. 7 shows an example of an output of the property according to the exemplary embodiment.

The property generating unit 104 correlates the address group 207 with the register name group 307. That is, the property generating unit 104 refers to the database 108. The result of matching stored in the database 108 represents that the address group 207 corresponds to the register name group 307. The property generating unit 104 describes the address group 207 and the register name group 307 stored in the database 108 in the variable 501 and 502 of the model property included in the property format file 107, respectively, and generates the property 109 as shown in FIG. 7 (S204), and finishes processing.

Further, in the exemplary embodiment, a case where an address group corresponds to a register name group arranged in ascending order is described as an example for simplification, but the present invention is not limited to the case. Even if an address group and a register name group are not arranged in ascending order, but if a list which correlates an address group with a register name group in the database 108 is prepared, the exemplary embodiment is applicable.

As described above, the property generating apparatus of the exemplary embodiments generates a property representing a specification of an integrated circuit and verifying design information on said integrated circuit described in RTL (Register Transfer Level), and includes the storage unit (database 108), the address expanding unit 101, the RTL analysis unit 102, and the property generation unit 104. The storage unit stores a register name to identify a register. The address expanding unit 101 expands property abbreviated description information on a group of registers including said register, and generates a group of addresses. The RTL analysis unit 102 selects a group of register names from the register name stored in the storage unit. The property generation unit 104 generates the property by correlating the group of addresses with the group of register names. Therefore, it automatically creates the property representing the specification of the integrated circuit with less work.

An exemplary advantage according to the invention is that the property generating apparatus creates a property with less work. For example, when a property is created for structure corresponding to one sheet (a register group described above) of one-type-N-sheets structure (plural registers described above) of an LSI, man-hours necessary for creating the property becomes smaller than before by using the abbreviation property file 106 according to the exemplary embodiment.

The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

What is claimed is:

1. A property automatically generating apparatus, which generates a property representing a specification of an integrated circuit described in a specification description language in order to verify design information by a verifying tool, in said design information the integrated circuit being described in RTL (Register Transfer Level) using a hardware description language, comprising:
    an address expanding unit, to which a property abbreviated description file regarding a group of registers among a plurality of registers is given; and
    a database, which stores a register name to identify each of said plurality of registers, wherein
    said register name includes a group of hierarchy instances representing a character string,
    in said property abbreviated description file, an abbreviated register name, which identifies said group of registers and includes said group of hierarchy instances, and an abbreviated address, which includes a group of bit sections corresponding, respectively, to said group of hierarchy instances of said abbreviated register name, are described,
    each of said group of bit sections represents a bit string,
    a specific hierarchy instance of said group of hierarchy instances of said abbreviated register name represents a symbol different from said character string,
    a specific bit section of said group of bit sections of said abbreviated address, which corresponds to said specific hierarchy instance, represents a symbol corresponding to a number of bit as said bit string,
    said address expanding unit expands an address and generates a group of addresses, based on said abbreviated address of said property abbreviated description file, a number of said specific bit section and a bit number of said specific bit section, and
    said property automatically generating apparatus further comprises:
    an RTL analysis unit, which selects a register name, as said group of register names, from said respective register names of said plurality of registers stored in said database, said register name corresponding to said group of hierarchy instances of said abbreviated register name of said property abbreviated description file, said register name including a group of hierarchy instances corresponding to a hierarchy instance other than said specific hierarchy instance; and
    a property generation unit, which generates said property correlating said group of addresses with said group of register names.

2. The property automatically generating apparatus according to claim 1, wherein
    said address expanding unit expands an address and generates said group of addresses based on said abbreviated address of said property abbreviated description file, the number of said specific bit section and the bit number of said specific bit section, and correlates said group of addresses with said abbreviated register name of said property abbreviated description file, and stores in said database,
    said RTL analysis unit selects said group of register names from said respective register names of said plurality of registers, with reference to said database, and stores a list representing said group of register names in said database, and
    said property generation unit generates said property, which correlates said group of addresses with said group of register names, with reference to said database.

3. The property automatically generating apparatus according to claim 1, further comprising:
a matching processing unit, which performs matching whether said group of addresses corresponds to said group of register names or not, with reference to said database, and stores a result of matching in said database, wherein
said property generation unit, with reference to said database, generates said property, when said result of matching shows that said group of addresses corresponds to said group of register names.

4. The property automatically generating apparatus according to claim 1, wherein
a property format file is given to said property generation unit, in said property format file a model property correlating said group of addresses and said group of register names being described, and
said property generation unit describes said group of addresses and said group of register names in said model property, and generates said property.

5. The property automatically generating apparatus according to claim 1, wherein
when the number of said specific bit section is represented by n (n is an integer), and bit numbers of said n specific bit sections are represented by M1 to Mn (M1 to Mn are integers), respectively, m addresses exist, which are expanded by said abbreviated address, where $$m = 2^{\sum_{k=1}^{n} Mk}$$ [formula 1]

and, said address expanding unit, for said abbreviated address, generates said m addresses as said group of addresses.

6. A property automatically generating method, by a computer including a storage unit storing a computer program and a CPU for executing said computer program, for generating a property representing a specification of an integrated circuit described in a specification description language in order to verify design information by a verifying tool, in said design information the integrated circuit being described in RTL (Register Transfer Level) using a hardware description language, comprising:
a first step, by said CPU, of inputting a property abbreviated description file regarding a group of registers among a plurality of registers; and
a second step, by said CPU, of storing a register name to identify each of the plurality of registers in a database, wherein
said register name includes a group of hierarchy instances representing a character string,
in said property abbreviated description file, an abbreviated register name, which identifies said group of registers and includes said group of hierarchy instances, and an abbreviated address, which includes a group of bit sections corresponding, respectively, to said group of hierarchy instances of said abbreviated register name, are described,
each of said group of bit sections represents a bit string,
a specific hierarchy instance of said group of hierarchy instances of said abbreviated register name represents a symbol different from said character string,
a specific bit section of said group of bit sections of said abbreviated address, which corresponds to said specific hierarchy instance, represents a symbol corresponding to a number of bit as said bit string, and said method further comprises:
a third step, by said CPU, of expanding an address and generating a group of addresses, based on said abbreviated address of said property abbreviated description file, a number of said specific bit section and a bit number of said specific bit section;
a fourth step, by said CPU, of selecting a register name, as said group of register names, from said respective register names of said plurality of registers stored in said database, said register name corresponding to said group of hierarchy instances of said abbreviated register name of said property abbreviated description file, said register name including a group of hierarchy instances corresponding to a hierarchy instance other than said specific hierarchy instance; and
a fifth step, by said CPU, of generating said property correlating said group of addresses with said group of register names.

7. The property automatically generating method according to claim 6, wherein
in said third step, said CPU expands an address and generates said group of addresses based on said abbreviated address of said property abbreviated description file, the number of said specific bit section and the bit number of said specific bit section, and said CPU correlates said group of addresses with said abbreviated register name of said property abbreviated description file, and stores in said database,
in said fourth step, said CPU selects said group of register names from said respective register names of said plurality of registers, with reference to said database, and stores a list representing said group of register names in said database, and
in said fifth step, said CPU generates said property, which correlates said group of addresses with said group of register names, with reference to said database.

8. The property automatically generating method according to claim 6, further comprising:
a sixth step, by said CPU, of performing matching whether said group of addresses corresponds to said group of register names or not, with reference to said database, and storing a result of matching in said database, wherein
in said fifth step, with reference to said database, said CPU generates said property, when said result of matching shows that said group of addresses corresponds to said group of register names.

9. The property automatically generating method according to claim 6, further comprising:
a step, by said CPU, of inputting a property format file, in which a model property correlating said group of addresses and said group of register names is described, wherein
in said fifth step, said CPU describes said group of addresses and said group of register names in said model property, and generates said property.

10. The property automatically generating method according to claim 6, wherein
when the number of said specific bit section is represented by n (n is an integer), and bit numbers of said n specific bit sections are represented by M1 to Mn (M1 to Mn are integers), respectively, m addresses exits, which are expanded by said abbreviated address, where $$m = 2^{\sum_{k=1}^{n} M_k} \quad \text{[formula 2]}$$

and, in said third step, said CPU, for said abbreviated address,
generates said m addresses as said group of addresses.

11. A non-transitory computer readable medium storing a computer program for making a computer including a CPU execute a processing for generating a property representing a specification of an integrated circuit described in a specification description language in order to verify design information by a verifying tool, in said design information the integrated circuit being described in RTL (Register Transfer Level) using a hardware description language, the computer program making said computer execute:
- a first step, by said CPU, of inputting a property abbreviated description file regarding a group of registers among a plurality of registers; and
- a second step, by said CPU, of storing a register name to identify each of the plurality of registers in a database, wherein
said register name includes a group of hierarchy instances representing a character string,
in said property abbreviated description file, an abbreviated register name, which identifies said group of registers and includes said group of hierarchy instances, and an abbreviated address, which includes a group of bit sections corresponding, respectively, to said group of hierarchy instances of said abbreviated register name, are described,
each of said group of bit sections represents a bit string,
a specific hierarchy instance of said group of hierarchy instances of said abbreviated register name represents a symbol different from said character string,
a specific bit section of said group of bit sections of said abbreviated address, which corresponds to said specific hierarchy instance, represents a symbol corresponding to a number of bit as said bit string, and
said computer program further makes said computer execute:
- a third step, by said CPU, of expanding an address and generating a group of addresses, based on said abbreviated address of said property abbreviated description file, a number of said specific bit section and a bit number of said specific bit section;
- a fourth step, by said CPU, of selecting a register name, as said group of register names, from said respective register names of said plurality of registers stored in said database, said register name corresponding to said group of hierarchy instances of said abbreviated register name of said property abbreviated description file, said register name including a group of hierarchy instances corresponding to a hierarchy instance other than said specific hierarchy instance; and
- a fifth step, by said CPU, of generating said property correlating said group of addresses with said group of register names.

12. The non-transitory computer readable medium storing the computer program according to claim 11, wherein
in said third step, said CPU expands an address and generates said group of addresses based on said abbreviated address of said property abbreviated description file, the number of said specific bit section and the bit number of said specific bit section, and said CPU correlates said group of addresses with said abbreviated register name of said property abbreviated description file, and stores in said database,
in said fourth step, said CPU selects said group of register names from said respective register names of said plurality of registers, with reference to said database, and stores a list representing said group of register names in said database, and
in said fifth step, said CPU generates said property, which correlates said group of addresses with said group of register names, with reference to said database.

13. The non-transitory computer readable medium storing the computer program according to claim 11, further making said computer execute
a sixth step, by said CPU, of performing matching whether said group of addresses corresponds to said group of register names or not, with reference to said database, and storing a result of matching in said database, wherein
in said fifth step, with reference to said database, said CPU generates said property, when said result of matching shows that said group of addresses corresponds to said group of register names.

14. The non-transitory computer readable medium storing the computer program according to claim 11, further making said computer execute
a step, by said CPU, of inputting a property format file; in which a model property correlating said group of addresses and said group of register names is described, wherein
in said fifth step, said CPU describes said group of addresses and said group of register names in said model property, and generates said property.

15. The non-transitory computer readable medium storing the computer program according to claim 11, wherein
when the number of said specific bit section is represented by n (n is an integer), and bit numbers of said n specific bit sections are represented by M1 to Mn (M1 to Mn are integers), respectively, m addresses exits, which are expanded by said abbreviated address, where $$m = 2^{\sum_{k=1}^{n} M_k} \quad \text{[formula 3]}$$

and, in said third step, said CPU, for said abbreviated address, generates said m addresses as said group of addresses.

* * * * *